(12) United States Patent
Hoffman (10) Patent No.: US 7,756,175 B2
(45) Date of Patent: Jul. 13, 2010

(54) PUMPED SEMICONDUCTOR LASER SYSTEMS AND METHODS

(75) Inventor: Robert C. Hoffman, Woodstock, VA (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 23 days.

(21) Appl. No.: 12/261,391

(22) Filed: Oct. 30, 2008

(65) Prior Publication Data

US 2010/0111124 A1    May 6, 2010

(51) Int. Cl.
*H01S 3/04* (2006.01)
*H01S 3/14* (2006.01)
(52) U.S. Cl. ..................... 372/39; 372/43.01
(58) Field of Classification Search ............ 372/39
See application file for complete search history.

(56) References Cited

U.S. PATENT DOCUMENTS

| | | | |
|---|---|---|---|
| 5,317,584 A | | 5/1994 | Mori et al. |
| 5,416,884 A | | 5/1995 | Hirata et al. |
| 6,072,815 A | * | 6/2000 | Peterson ............ 372/36 |
| 6,490,309 B1 | * | 12/2002 | Okazaki et al. ........ 372/75 |
| 7,136,408 B2 | * | 11/2006 | Spinelli et al. ........ 372/70 |

OTHER PUBLICATIONS

D.M. Bagnall, "Microcavity Lasing of Optically Excited Cadmium Sulfide Thin Films at Room Temperature," Optics Letters, vol. 24, No. 18, Sep. 15, 1999.
J.R. Packard, et al."Standing Waves and Single-Mode Room-Temperature Laser Emission From Electron-Beam Pumped Cadmium Sulfide," IEEE Journal of Quantum Electronics, vol. QE-5, No. 1, pp. 44-47.
"Ultraviolet Biological Trigger Lidar," SESI webpage dated Jul. 13, 2006, http://sesius.com/Products/RD/BiologicalTriggerLidar.htm.
"Ultra-violet (UV) Lasers," PARC webpage dated Jul. 13, 2006, http://www.parc.com/research/projects/uvlasers.html.

* cited by examiner

Primary Examiner—Armando Rodriguez
(74) Attorney, Agent, or Firm—Lawrence E. Anderson (57) ABSTRACT

A method for emitting laser radiation includes: emitting first laser radiation using a first laser, wherein said first laser is a laser diode; receiving the first laser radiation by a second laser comprising $CdSe_{(1-x)}S_x$ (cadmium selenium sulfide, cadmium selenium, or cadmium sulfide), wherein x is between 0 and 1, inclusively; and responsive to receiving the first laser radiation by the second laser, emitting second laser radiation by the second laser via the $CdSe_{(1-x)}S_x$; wherein the second laser radiation has a wavelength between 487 nm and 690 nm; and wherein the wavelength of the second laser radiation is responsive to the value of x, which represents the relative concentration of selenium and/or sulfur.

8 Claims, 10 Drawing Sheets

PUMPED SEMICONDUCTOR LASER SYSTEMS AND METHODS

GOVERNMENT INTEREST

The invention described herein may be manufactured, used, and licensed by or for the United States Government.

TECHNICAL FIELD

The present disclosure relates generally to optics and, more particularly, to pumped semiconductor lasers which emit light at a preselected wavelength.

DESCRIPTION OF RELATED ART

A laser diode is a laser where the active medium is a semiconductor similar to the semiconductors found in light emitting diodes. One method of exciting the atoms in lasers, called pumping, is achieved by illuminating the semiconductor material with a high-energy light source, such as xenon flash tubes, are lamps, or metal-vapor lamps.

Generally, in optically pumped laser diodes the gain region of the laser is surrounded with an optical cavity, forming a Fabry-Perot resonator. In its simplest form, a waveguide is formed on the crystal surface of the semiconductor, confining the light to a narrow line. Photons emitted in a longitudinal mode of the waveguide may be reflected back and forth several times before being emitted from the laser. As the light is amplified by stimulated emission, the laser begins to "lase." The geometry of the optical cavity is such that when only a narrow beam of light is desired, the vertical (perpendicular to the semiconductor layer) and horizontal (width) directions are sufficiently narrow (on the order of the optical wavelength) such that each supports only a single optical mode. The length of the waveguide is consistent with the longitudinal mode to be supported. In general, the wavelength of the light emitted is dependent upon the band-gap of the semiconductor and the modes of the optical cavity. Generally, the maximum gain will occur for photons slightly above the band-gap energy, and the modes nearest the gain peak will lase with the most intensity. Some instability has arisen in laser diodes that operate at a single wavelength due to fluctuations in current or temperature. In particular, there is a need for lasers that produce light in the green region of the light spectrum in a stable manner.

There have previously been attempts to address the "green gap" problem in semiconductor lasers where conventional green DPSS lasers create a need for a more stable system.

In the past, in order to create lasers that lase at a particular wavelength, such as in the green portion of the spectrum, frequency doubling crystals have been utilized. By way of background, crystal materials used in semiconductor lasers can exhibit nonlinearity, which can give rise to the phenomenon of frequency doubling, where an input (pump) wave generates another wave with twice the optical frequency (i.e., half the wavelength) in the medium. This process is also called second-harmonic generation. In most cases, the pump wave is delivered in the form of a laser beam, and the frequency-doubled (second-harmonic) wave is generated in the form of a beam propagating in a similar direction.

The physical mechanism behind frequency doubling can be understood as follows. Due to the nonlinearity, the fundamental (pump) wave generates a nonlinear polarization which oscillates with twice the fundamental frequency. According to Maxwell's equations, this nonlinear polarization radiates an electromagnetic field with this doubled frequency. Due to phase matching issues, the generated second-harmonic field propagates dominantly in the direction of the nonlinear polarization wave. The latter also interacts with the fundamental wave, so that the pump couples power from the pump wave to the second-harmonic wave. For low pump intensities, the second-harmonic conversion efficiency is small and grows linearly with increasing pump intensity, so that the intensity of the second-harmonic (frequency-doubled) wave grows with the square of the pump intensity. Once pump depletion becomes significant, the further rise of second-harmonic power becomes slower.

Frequency doubling is a phase-sensitive process which usually requires phase matching to be efficient. Basically, this means that the second-harmonic field contributions generated at different locations in the nonlinear crystal coherently add up at the crystal's exit face. With proper phase matching and a pump beam with high intensity, high beam quality, and moderate optical bandwidth, achievable power conversion efficiencies may exceed 50%. On the other hand, the conversion efficiencies are typically extremely small when phase matching does not occur. In such cases, the energy transferred by the nonlinearity quickly oscillates back and forth between pump and second-harmonic wave, rather than consistently going in a certain direction.

The lack of phase matching is also the reason why second-harmonic generation is usually not accompanied by other processes such as sum-frequency generation of the pump and second-harmonic wave, or second-harmonic generation of the second-harmonic wave itself: phase matching for second-harmonic generation usually does not imply phase matching for the other mentioned processes.

The present invention addresses the "green gap" problem (lack of suitable lasers in the green area of the spectrum) by utilizing II-VI group semiconductor compounds. Examples of II-VI group compounds used in conjunction with semiconductors are disclosed in, for example, in U.S. Pat. No. 5,416,884 ('884 patent) for "Semiconductor Waveguide Structure of a II-VI Group Compound," by Hirata, et al., hereby incorporated by reference. The '884 patent discloses a semiconductor waveguide structure utilizing clad and waveguide layers, each formed of a II-VI group compound semiconductor made of a II group element (e.g., Zn, Cd, Mg, Hg, etc.) and a VI group element (e.g., O, S, Se, Te, etc.). In the '884 patent, by a hetero-epitaxy method, thin films of a clad layer, waveguide layers and another clad layer are formed on a ZnSe substrate. As an example, in the waveguide layer formed of $Zn_{0.8}Cd_{0.2}S_{0.3}Se_{0.7}$ a beam of a wavelength of 530 nm is utilized. The waveguide structure in the '884 patent comprises layers formed by a compounds of the formula $Zn_yCd_{1-y}S_xSe_{1-x}$ (where X and Y are each greater than or equal to 0 and less than or equal to 1), such as, for example, film layers of $Zn_{0.6}Cd_{0.4}S_{0.6}Se_{0.4}$ and $Zn_{0.8}Cd_{0.2}S_{0.3}Se_{0.7}$.

A further example of the disclosure of a II-VI Group semiconductor compound being used in a semiconductor laser is U.S. Pat. No. 5,317,584 ('584 patent) to Mori, et al., hereby incorporated by reference. In the '584 patent, a sulfur/selenium compound is utilized as a current blocking layer in a semiconductor laser, due to the II-IV group layer's high resistance. The II-VI group compound semiconductor layers, such as those disclosed in the '584 patent, may include, for example, ZnSe, ZnS, ZnSSe, ZnCdS, or CdSSe.

In an article entitled "Standing Waves and Single-Mode Room-Temperature Laser Emission From Electron-Beam Pumped Cadmium Sulfide," by J. R. Packard, et al., IEEE Journal of Quantum Electronics, Vol. QE-5, No. 1, pp. 44-7, there is disclosed electron beam pumping in a direction perpendicular to the surface of the waveguide of a Cadmium Sulfide Laser which reportedly resulted in single self-sustained axial mode of oscillation at roughly 520 nm, and radiation outputted in a direction parallel to the input. During the experimentation process, the maximum peak power was reported to be 14 watts.

The prior art also discloses "Microcavity Lasing of Optically Excited Cadmium Sulfide Thin Films at Room Temperature," in an article by D. M. Bagnall, et al., Optics Letters, Vol. 24, No. 18, Sep. 15, 1999. The Bagnall article reports that poor room-temperature luminescence is characteristic of CdS, and that "green emission from CdS is difficult to achieve at room temperature," but "that excitonic emissions at cryogenic temperatures have been reported for CdS grown on $CaF_2$ . . . ." The Bagnall article appears to show that room-temperature green luminescence and lasing can be obtained by optically excited CdS thin films grown by pulsed laser deposition. However in the Bagnall article, a $CdSe_{(1-x)}S_x$ microchip laser system (where $0 \leq x \geq 1$) has not been fully optimized.

SUMMARY

Systems and methods for emitting laser radiation are provided. An embodiment of a method for emitting laser radiation includes: emitting first laser radiation using a first laser, wherein said first laser is a laser diode; receiving the first laser radiation by a second laser comprising $\Psi Se_{(1-x)}S_x$ (e.g., cadmium selenium sulfide, cadmium selenium, or cadmium sulfide), wherein $\Psi$ is a Group II element, such as Cadmium, and x is between 0 and 1, inclusively; and responsive to receiving the first laser radiation by the second laser, emitting second laser radiation by the second laser via the $\Psi Se_{(1-x)}S_x$; wherein the second laser radiation has a wavelength between 487 nm and 690 nm; and wherein the wavelength of the second laser radiation is responsive to the value of x.

An embodiment of a system for emitting laser radiation includes: a first laser configured to emit first laser radiation, wherein said first laser is a laser diode; a second laser comprising $CdSe_{(1-x)}S_x$ (cadmium selenium sulfide, cadmium selenium, or cadmium sulfide), wherein x is between 0 and 1, inclusively, the second laser being configured to receive the first laser radiation and to emit second laser radiation responsive to receiving the first laser radiation; wherein the second laser radiation has a wavelength between 487 nm and 690 nm; and wherein the wavelength of the second laser radiation is responsive to the value of x.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION

Systems and methods for emitting laser radiation are provided. In this regard, an embodiment of such a system provides continuous waves (CW) or pulsed laser radiation having a selectable wavelength between about 487 nm and 690 nm. This may be achieved by using a laser diode to pump a $CdSe_{(1-x)}S_x$ (cadmium selenium sulfide, cadmium selenium, or cadmium sulfide) microchip laser that produces the desired wavelength, wherein x has a value between 0 and 1, inclusively. As a result, frequency doubling may be avoided so that power does not oscillate between competing longitudinal modes, thereby achieving a higher efficiency and more stable output.

Figure 1A:
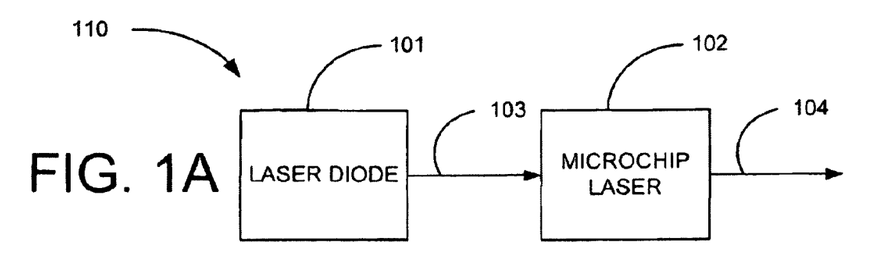
FIG. 1A is a simplified block diagram depicting an embodiment of a system for emitting laser radiation.

FIG. 1A is a simplified block diagram depicting an embodiment of a system 110 for emitting laser radiation. The system 110 uses a microchip laser 102 pumped by laser radiation from a laser diode 101. The laser diode 101 may be, for example, a high power (e.g., >50 mW) AlGaInN (aluminum gallium indium nitride) laser diode. The microchip laser 102 may be, for example, a $CdSe_{(1-x)}S_x$ laser. The laser diode 101 is configured to emit radiation 103 which is then received by the microchip laser 102. The microchip laser 102 is configured to emit radiation 104 responsive to receiving the radiation 103. In this embodiment, of the invention the radiation 103 has a wavelength of 405 nm, whereas the radiation 104 has a wavelength between 487 nm and 690 nm. In other embodiments, the radiation 103 may alternatively have other wavelengths, such as for example, between 375 nm and 450 nm.

Figure 1B:
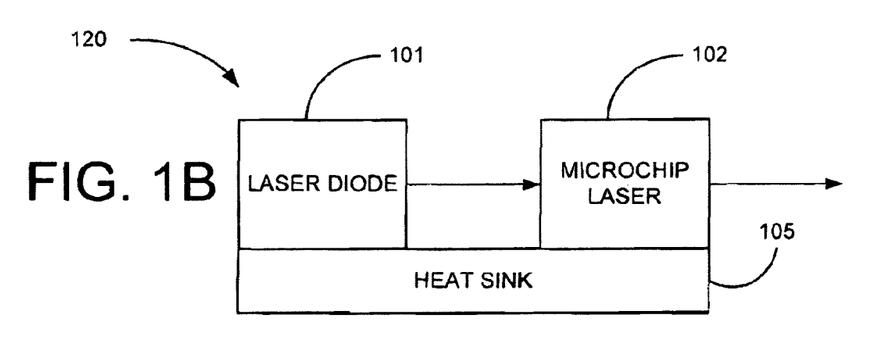
FIG. 1B is a simplified block diagram depicting the system of FIG. 1A in addition to a heat sink.

FIG. 1B is a simplified block diagram depicting an embodiment of a system 120 for emitting laser radiation. The system 120 includes the laser diode 101 and the microchip laser 102, which function as described in relation to FIG. 1A. As shown in FIG. 1B, the laser diode 101 and the microchip laser 102 are mounted on the heat sink 105 that is configured to help cool the laser diode 101 and the microchip laser 102.

Figure 1C:
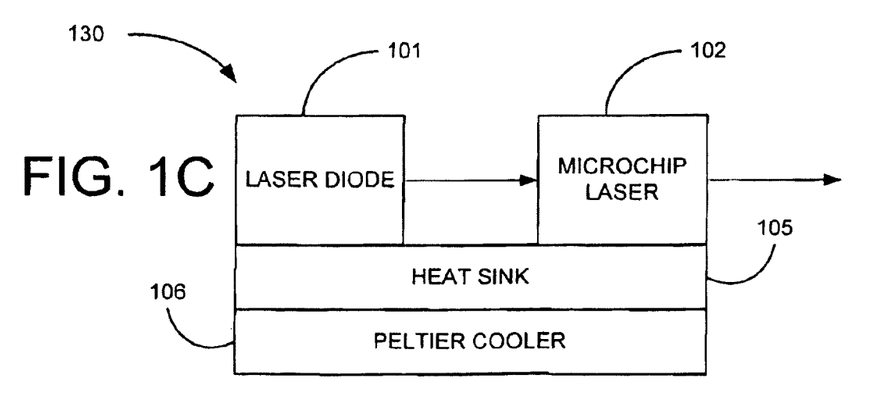
FIG. 1C is a simplified block diagram depicting the system of FIG. 1B in addition to a peltier cooler.

FIG. 1C is a simplified block diagram depicting an embodiment of a system 130 for emitting laser radiation. The system 130 includes the laser diode 101 and the microchip laser 102, which function as described in relation to FIG. 1A. As shown in FIG. 1C, the laser diode 101 and the microchip laser 102 are mounted on a heat sink 105, which is in turn mounted on a peltier cooler 106. A single or multistage the peltier cooler 106 may be used to remove excess heat and to stabilize the system 130 at a desirable temperature for laser operation. The system 130 may be enclosed in a hermetically sealed space to prevent condensation of water on optical components, in a manner well known in the art.

Figure 1D:
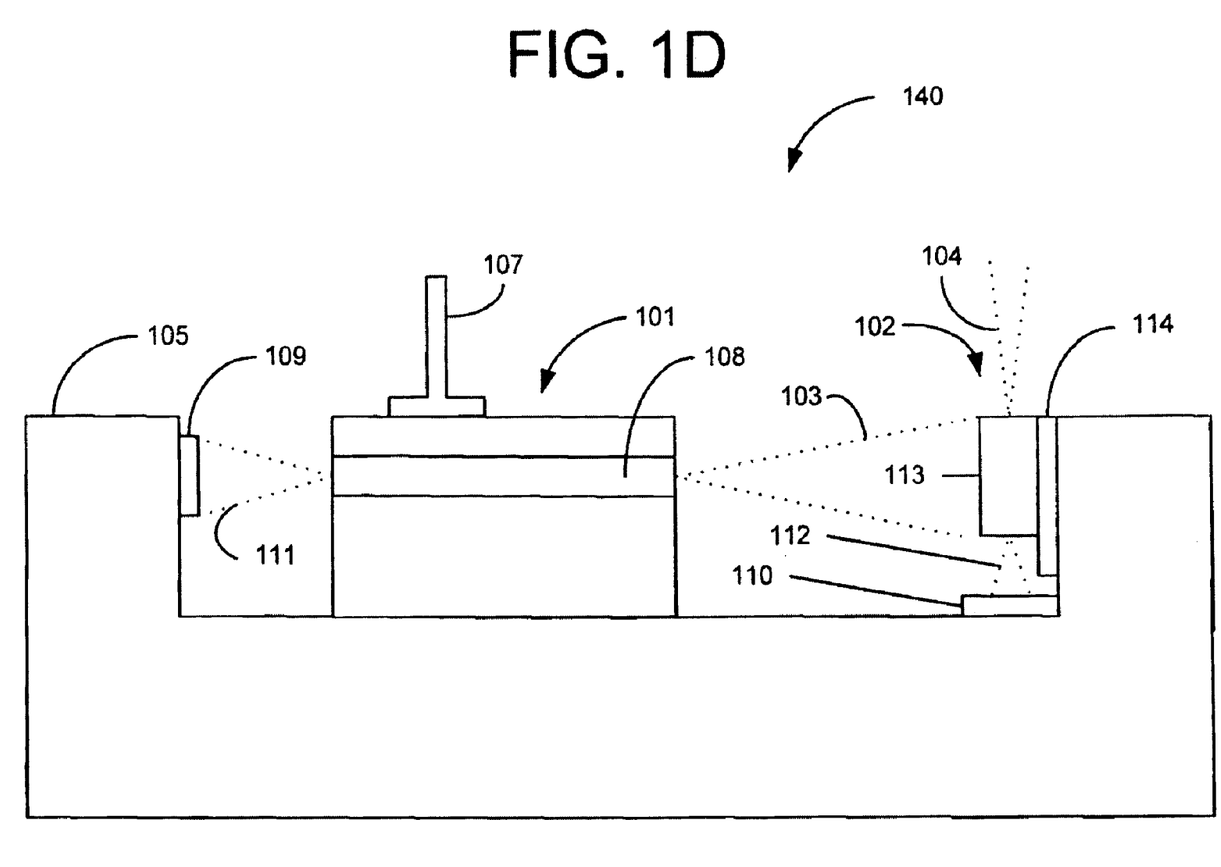
FIG. 1D is a schematic diagram depicting another embodiment of the system for emitting laser radiation.

FIG. 1D is a schematic diagram depicting an embodiment of a system 140 for emitting laser radiation. The system 140 includes the laser diode 101 and the microchip laser 102. The laser diode 101 is configured to emit radiation 103 which is received by the microchip laser 102. The microchip laser 102 is configured to emit radiation 104 responsive to receiving the radiation 103. In addition to emitting the radiation 103, the laser diode 101 emits radiation 111 via the active region 108, which is where the pump radiation 103 from laser 101 is absorbed by the microchip laser 102. The radiation 111 is received by the photodiode 109, which is used to help regulate the laser diode 101 to ensure stable power output. Similarly, the microchip laser 102 emits radiation 112 onto the photodiode 110, which is used to help regulate the microchip laser 102.

The microchip laser 102 includes an emitter 113 and a substrate 114. The emitter 113 comprises $CdSe_{(1-x)}S_x$ (with x having a value between 0 and 1, inclusively) whereas the substrate 114 may comprise Silicon Carbide (SiC) or sapphire ($AL_2O3$). The laser diode 101, the microchip laser 102, the photodiode 109, and the photodiode 110 are mounted on the heat sink 105 which helps to cool these components. The heat sink may be mounted on a Peltier cooler (not shown in FIG. 1D) to help regulate the temperature of the system. The detailed process by which the emitter 113 is fabricated is important. Previous attempts at fabricating $CdSe_{(1-x)}S_x$ have relied upon thin-film growth via a crystal-growth method such as MOCVD (Metal Oxide Chemical Vapor Deposition) <a well-known vapor growth method. Fabricating p-n junctions amenable to direct current injection in $CdSe_{(1-x)}S_x$ has proven extremely difficult due to self-compensation of charge carriers (electrons or holes) of the doped materials and long-term instability of p-n junctions in $CdSe_{(1-x)}S_x$. This invention seeks to circumvent this difficulty by direct optical pumping which is largely insensitive to carrier compensation effects. Since there is no p-n junction, fabrication is greatly simplified, and this may be accomplished by a process such as, but no limited to, MOCVD, or any other chemical vapor deposition process. In the embodiment shown in, inter alia, FIG. 1D, depending upon the output wavelength desired, a specific relative concentration of $Se_{(1-x)}S_x$ is selected, as represented by x in FIG. 6. Once the composition has been chosen and the microchip laser 102 fabricated, the emission wavelength is fixed.

The radiation 112 from the microchip laser 102 may be monitored with the photodiode 110 to ensure stable power output. The radiation 103 and the radiation 111 emerge from the active region 108 as beams having elliptical cross-sections. These beams project elliptically shaped radiation spots onto the microchip laser 102 and the photodiode 109, respectively. These elliptically shaped radiation spots are a fundamental characteristic of laser radiation emitted from semiconductor devices. The laser diode 101 may be powered by a DC power supply (not shown) of approximately 5 volts via a p-side electrode 107 with the heat sink 105 acting as an n-side electrode. In a direct pumping configuration, the radiation 103 leaves the highly illuminated elliptical area 204 on the emitter 113.

In some embodiments, the radiation characteristic of the microchip laser 102 maybe similar to conventional laser diodes, since the microchip laser 102 may have approximately the same dimensions as the active region in most direct-current operated laser diodes. The radiation 104 may emerge as a beam having an elliptical cross-section, with the long axis of the ellipse being parallel to the length of the microchip laser 102.

Figure 2:
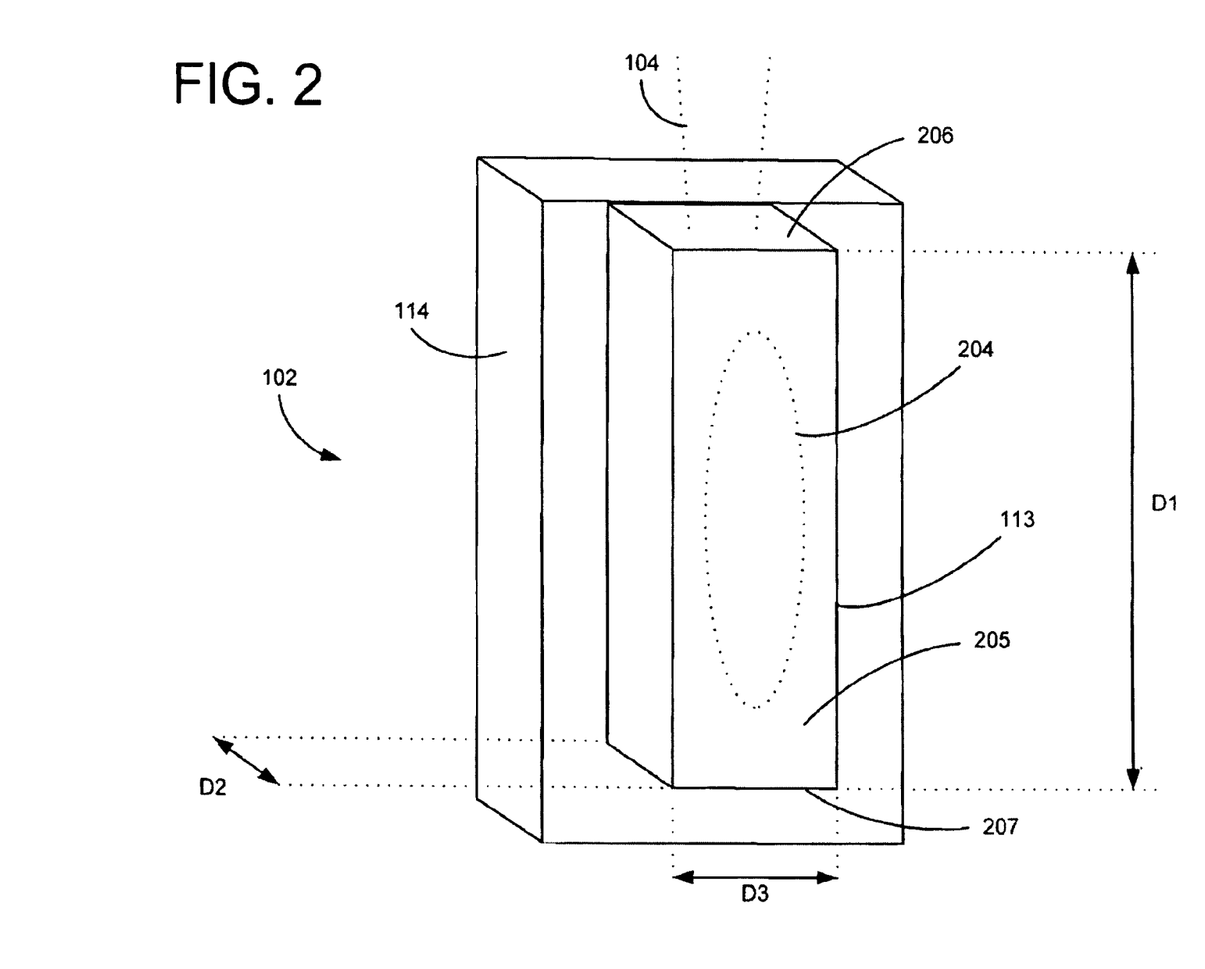
FIG. 2 is a schematic diagram depicting an embodiment of a microchip laser having a highly illuminated elliptical area on its emitter.

FIG. 2 is a schematic diagram depicting an embodiment of a microchip laser 102 having a highly illuminated elliptical area 204. The microchip laser 102 includes an emitter 113 and a substrate 114. The emitter 113 receives laser radiation from the laser diode 101 (FIGS. 1A-1D) via a highly illuminated elliptical area 204 and, in response, outputs the radiation 104. The emitter 113 may comprise $CdSe_{(1-x)}S_x$ whereas the substrate 114 may comprise, for example, SiC or $AL_2O_3$.

The emitter 113 may be grown on the substrate 114 by, for example, laser ablation, or any other suitable method for producing very high quality films with low defect and impurity state densities. The quality of the deposited material is important to the proper functioning of the microchip laser 102.

The emitter 113 may have a composition varying from pure CdS, emitting at 490 nm, to pure CdSe, emitting at 690 nm. The emitter 113 changes radiation wavelength in a linear manner from 490 nm to 690 nm as x varies from x=1 to x=0. The quantum efficiency, however, will be highest when the wavelength of the radiation 103 is closer to the wavelength of the radiation 104. The emitter 113 has a direct bandgap regardless of the alloy concentration chosen, thereby allowing highly efficient laser radiation. The use of so-called direct-bandgap materials is well known to those skilled in the field.

Due to the rapid extinction (absorption) of light (e.g., having a wavelength between about 375 nm and 450 nm) in the emitter 113, it may be very thin; its thickness D2 may be on the order of, for example, 2-5 µm. This is the effective depth that the emitter 113 can be optically pumped. The width D3 may be, for example, about 5-10 µm, enough to support a fundamental transverse mode ($TEM_{00}$) of the radiation 104. The length D1 may be, for example, between 30-50 µm or perhaps more depending on the gain length required to operate at a particular wavelength.

The emitter 113 may have a refractive index n=2.5, giving the emitter 113 air interface a reflectivity of only about 18%. Therefore the rear facet 207 may be high reflection coated with $MgF_2$, $TiO_2$, $SiO_2$ or similar dielectric coatings for the particular radiation wavelength chosen. The output facet 206 may be coated with $MgF_2$ or similar dielectric coatings to give the proper reflectivity to maximize the microchip laser output. The top facet 205 may have a dielectric anti-reflection coating fabricated with $MgF_2$, $TiO_2$, $SiO_2$ or similar dielectric coatings so that the laser diode 101 output may be efficiently coupled to the microchip laser 102.

Figure 3A:
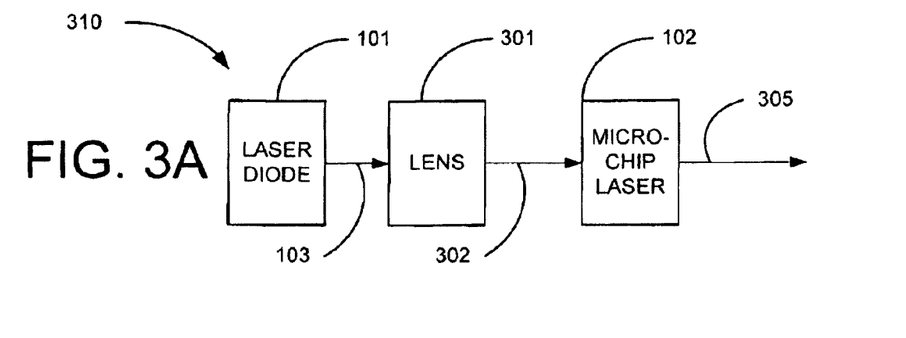
FIG. 3A is a simplified block diagram depicting an embodiment of a system for emitting laser radiation which uses an optical lens to focus radiation on a microchip laser.

FIG. 3A is a simplified block diagram depicting an embodiment of a system 310 for emitting laser radiation, which uses the optical lens 301 to focus the output of the laser diode 101 onto the microchip laser 102. The positive cylindrical convex optical lens 301 focuses only in one dimension, so that a circular or elliptical beam will be focused to a line on the microchip laser 102 by known techniques. Radiation 103 of the laser diode 101 is thereby focused into radiation 302, so as to increase efficiency because the radiation 302 is projected into a shape (linear) that more closely matches the shape of the receiving surface of the microchip laser 102. The microchip laser 102 receives the radiation 302 and in response emits radiation 305. In some embodiments, the radiation 103 has a wavelength between about 375 nm and 450 nm, whereas the radiation 305 has a wavelength between 487 nm and 690 nm, inclusively.

Figure 3B:
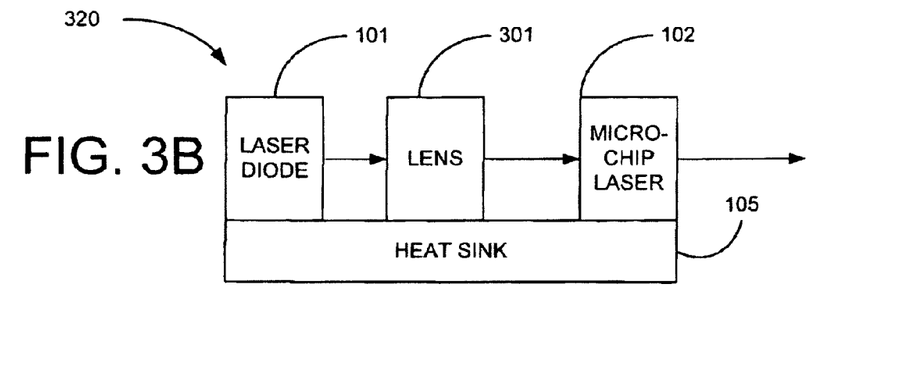
FIG. 3B is a simplified block diagram depicting the system of FIG. 3A in addition to a heat sink.

FIG. 3B is a simplified block diagram depicting an embodiment of a system 320 for emitting laser radiation. The system 320 includes the laser diode 101, the microchip laser 102, and the positive, cylindrical, convex optical lens 301, which function as described in relation to FIG. 3A. As shown in FIG. 3B, the laser diode 101, the mic+rochip laser 102, and the optical lens 301 are mounted on the heat sink 105 that is configured to help cool the laser diode 101 and the microchip laser 102.

Figure 3C:
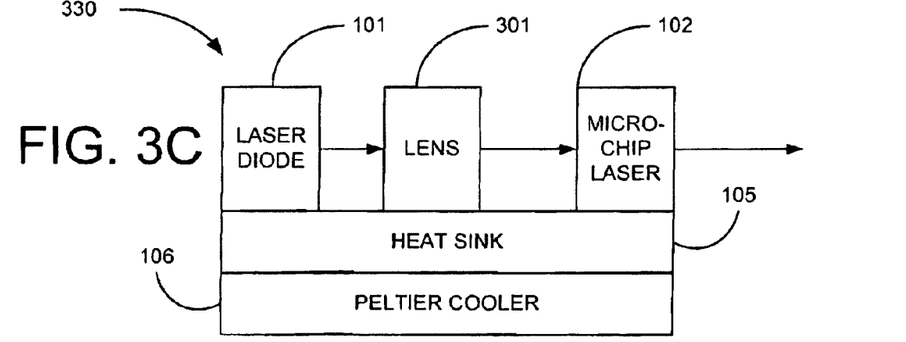
FIG. 3C is a simplified block diagram depicting the system of FIG. 3B in addition to a peltier cooler.

FIG. 3C is a simplified block diagram depicting an embodiment of a system 330 for emitting laser radiation. The system 330 includes the laser diode 101, the microchip laser 102, and the optical lens 301, which function as described in relation to FIG. 3A. As shown in FIG. 3C, the laser diode 101, the microchip laser 102, and the positive, cylindrical convex optical lens 301 are mounted on a heat sink 105, which is in turn mounted on a Peltier cooler 106. A single or multistage the Peltier cooler 106 may be used to remove excess heat and to stabilize the system 330 at a desirable temperature for laser operation. The system 330 may be enclosed in a hermetically sealed space to prevent condensation of water on optical components.

Figure 3D:
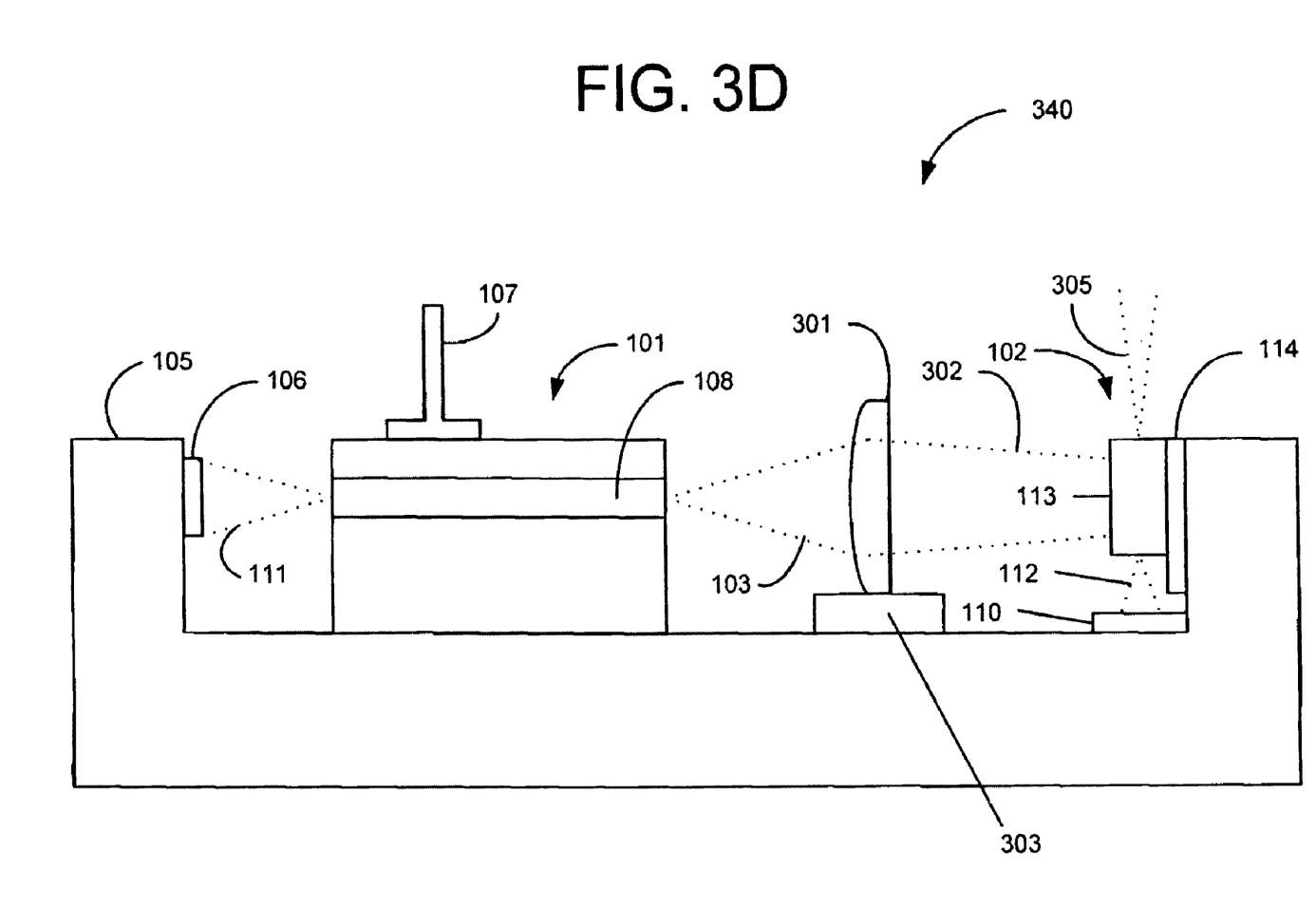
FIG. 3D is a schematic diagram depicting another embodiment of a system for emitting laser radiation.

FIG. 3D is a schematic diagram depicting an embodiment of a system 340 for emitting laser radiation. The system 340 includes the laser diode 101, the microchip laser 102, and the positive, cylindrical, convex optical lens 301. The microchip laser 102 includes an emitter 113 and a substrate 114. The laser diode 101 is configured to emit radiation 103. The optical lens 301 receives the radiation 103 and configures it into radiation 302, which emerges from the positive, cylindrical convex optical lens 301 as a linear stripe, with the long axis of the stripe being parallel to the length of the microchip laser 102.

The microchip laser 102 receives the radiation 302 and in response emits radiation 305. In addition to emitting the radiation 103, the laser diode 101 emits radiation 111 via the active region 108. The radiation 111 is received by the photodiode 106, which is used to help regulate the laser diode 101. Similarly, the microchip laser 102 emits radiation 112 onto the photodiode 110, which is used to help regulate the microchip laser 102. The laser diode 101, the microchip laser 102, the photodiode 106, the photodiode 110, and the optical lens 301 are mounted on the heat sink 105. The optical lens 301 may be mounted onto the heat sink 105 via a lens mount 303. The heat sink may be mounted on a Peltier cooler (not shown in FIG. 3D) to help regulate the temperature of the system.

Figure 4:
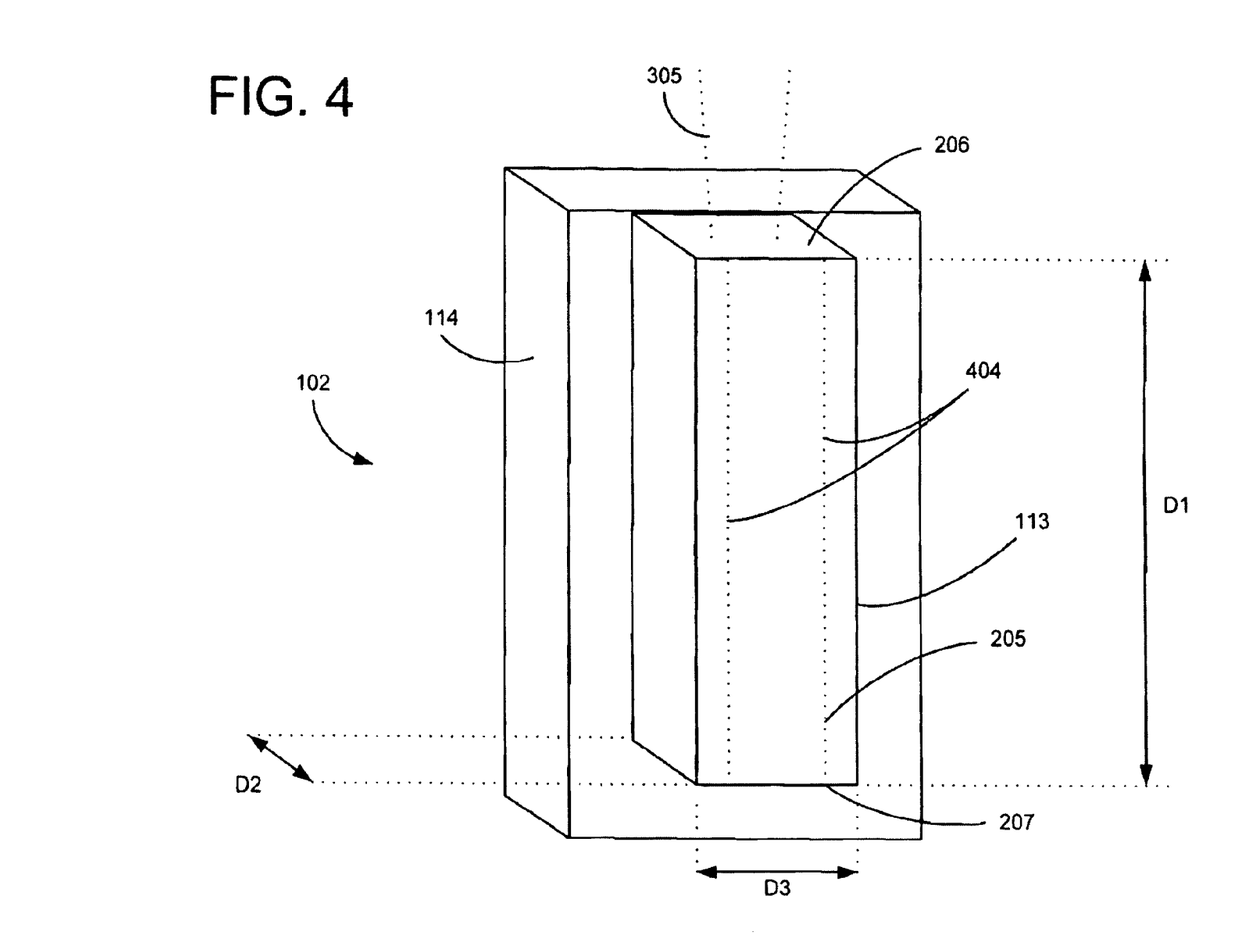
FIG. 4 is a schematic diagram depicting a microchip laser having a highly illuminated rectangular area on its emitter.

FIG. 4 is a schematic diagram depicting an embodiment of a microchip laser 102 having a highly illuminated rectangular area 404. The microchip laser 102 includes the emitter 113 and the substrate 114. The emitter 113 comprises $CdSe_{(1-x)}S_x$ (with x having a value between 0 and 1, inclusively) whereas the substrate 114 may comprise, for example, SiC or $AL_2O_3$. The thickness D2 may be on the order of, for example, 2-5 µm. The width D3 may be, for example, about 5-10 µm. The length D1 may be, for example, between 30-50 µm. The radiation 302 (FIG. 3D) projects onto the emitter 113 as a highly illuminated rectangular area 404. In response to receiving the radiation 302, the emitter 113 outputs radiation 305.

Figure 5A:
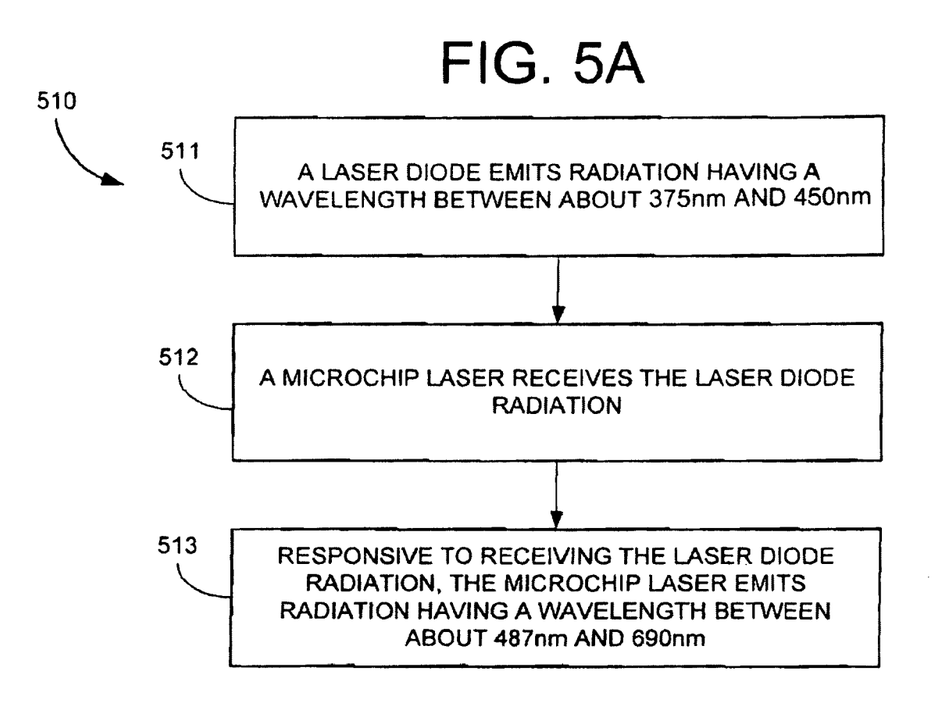
FIGS. 5A-5D are block diagrams depicting embodiments of methods for emitting laser radiation.

FIG. 5A is a block diagram depicting a method 510 for emitting laser radiation by the system 110 (FIG. 1A). According to step 511, a laser diode emits radiation having a wavelength between about 375 nm and 450 nm. According to step 512, a microchip laser receives the laser diode radiation. The microchip laser may be, for example, a $CdSe_{(1-x)}S_x$ microchip laser. According to step 513, responsive to receiving the laser diode radiation, the microchip laser emits radiation having a wavelength between about 487 nm and 690 nm.

Figure 5B:
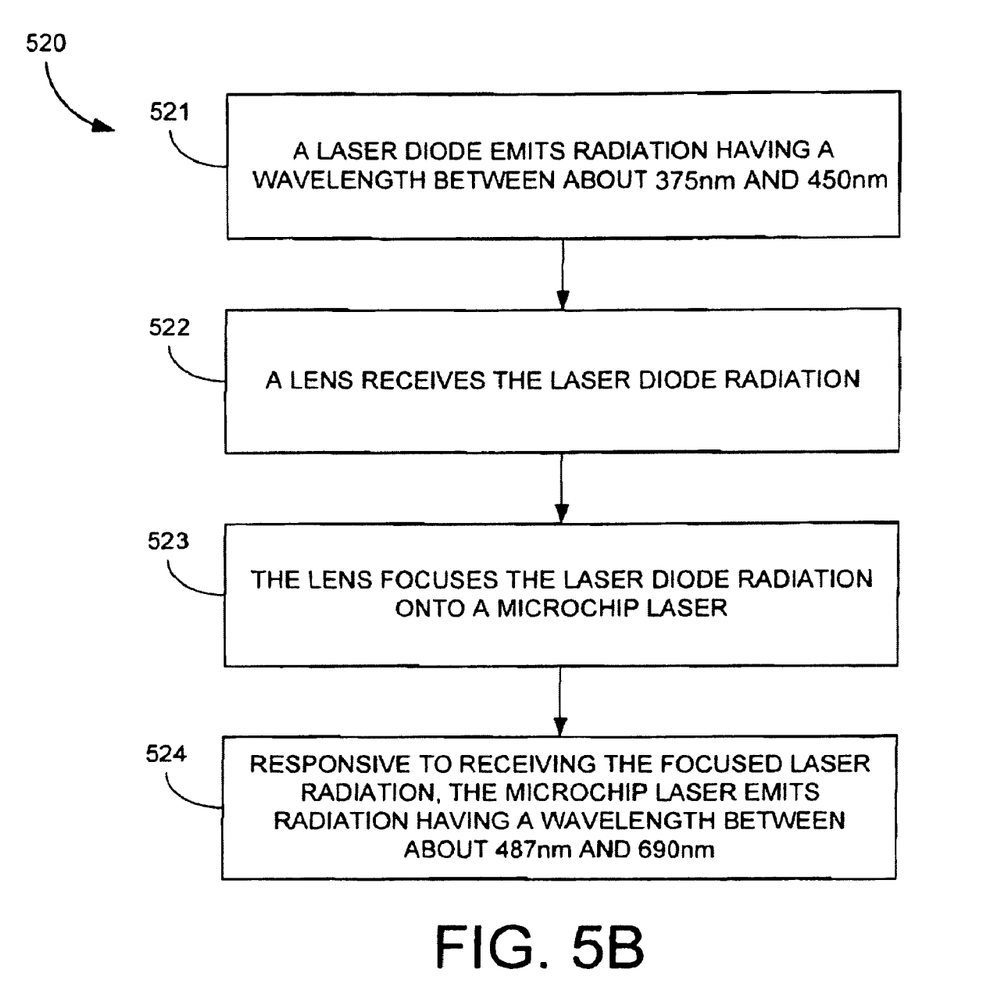

FIG. 5B is a block diagram depicting a method 520 for emitting laser radiation by the system 310 (FIG. 3A). According to step 521, a laser diode emits radiation having a wavelength between about 375 nm and 450 nm. According to step 522, a positive, cylindrical, convex optical lens receives the laser diode radiation. According to step 523, the positive, cylindrical, convex lens focuses the laser diode radiation onto a microchip laser. The microchip laser may be, for example, a $CdSe_{(1-x)}S_x$ microchip laser. According to step 524, responsive to receiving the focused laser radiation, the microchip laser emits radiation having a wavelength between about 487 nm and 690 nm.

Figure 5C:
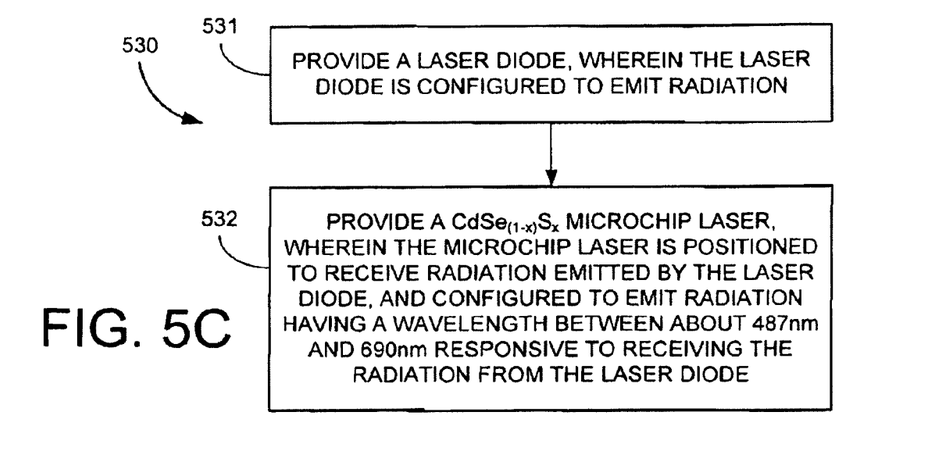

FIG. 5C is a block diagram depicting a method 530 for configuring a system 110 (FIG. 1A) to emit laser radiation. According to step 531, provide a laser diode, wherein the laser diode is configured to emit radiation. The laser diode radiation may have a wavelength, for example, between about 375 nm and 450 nm. Step 532 recites, inter alia, provide a $CdSe_{(1-x)}S_x$ microchip laser . . . ," wherein the value of x is between 0 and 1, inclusively. The microchip laser is positioned to receive radiation emitted by the laser diode, and is configured to emit radiation having a wavelength between about 487 nm and 690 nm responsive to receiving the radiation from the laser diode. The wavelength of the microchip laser radiation varies linearly from 487 nm and 690 nm responsive to the value of x, or relative concentration of sulfur and selenium, as illustrated in FIG. 6.

Figure 5D:
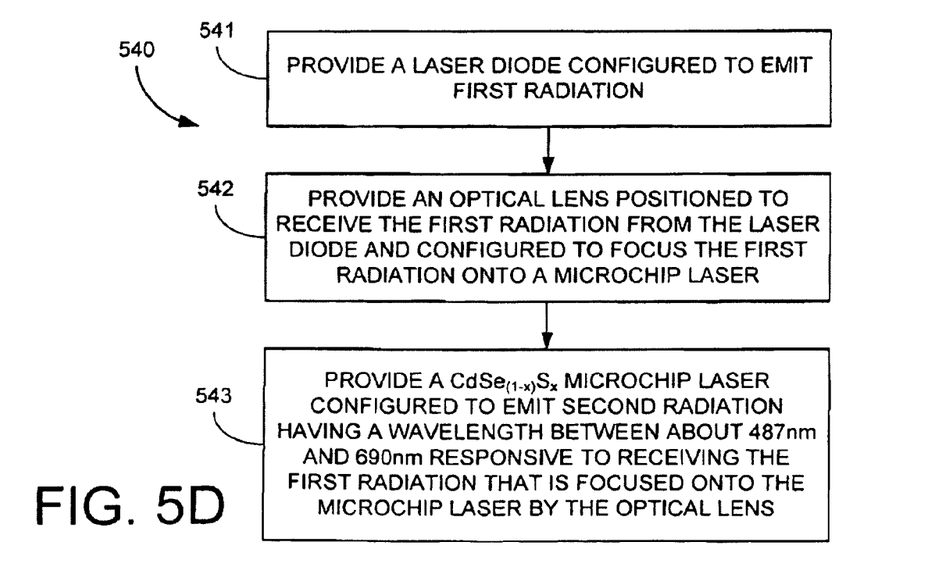

FIG. 5D is a block diagram depicting a method 540 for configuring a system 310 (FIG. 3A) to emit laser radiation. According to step 541, provide a laser diode configured to emit a first radiation. The first radiation may have a wavelength, for example, between about 375 nm and 450 nm. According to step 542, provide a positive, cyclindrical, convex optical lens positioned to receive the first radiation from the laser diode and configured to focus the first radiation onto a microchip laser. According to step 543, provide a Cd $Se_{(1-x)}S_x$ microchip laser configured to emit a second radiation having a wavelength between about 487 nm and 690 nm responsive to receiving the first radiation that is focused onto the microchip laser by the optical lens. The value of x in the $CdSe_{(1-x)}S_x$ is between 0 and 1, inclusively. The wavelength of the second radiation varies linearly from 487 nm and 690 nm responsive to the value of x, as illustrated in FIG. 6, indicative of the relative sulfur and/or selenium concentration.

Figure 6:
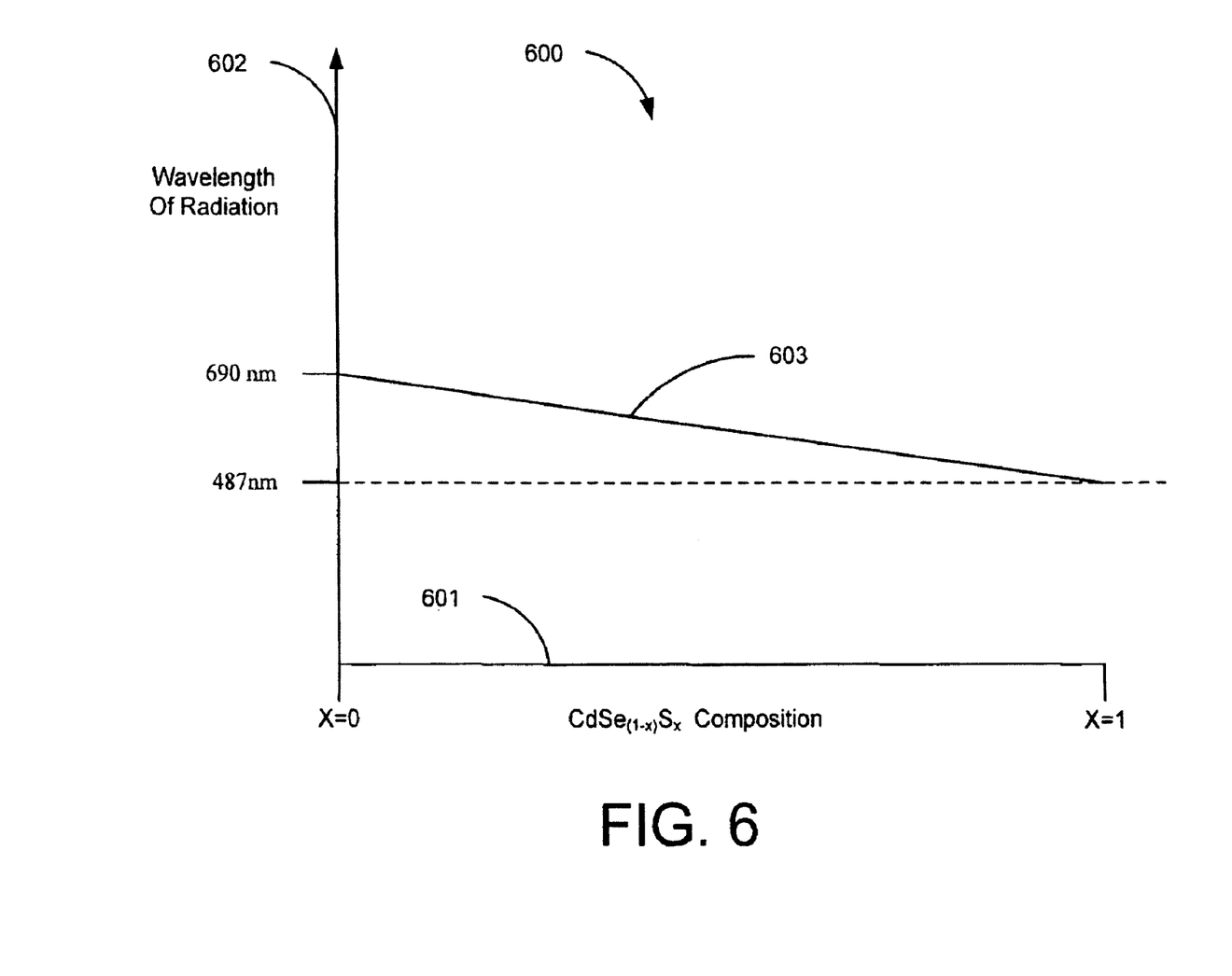
FIG. 6 is a graph showing the relationship between the composition of the emitter shown in FIGS. 2 and 4 and the wavelength of the radiation emitted by the emitter.

FIG. 6 depicts a graph 600 showing the relationship between the composition of the emitter 113 (FIGS. 2 and 4) and the wavelength of the radiation emitted by the emitter 113. The emitter 113 comprises $CdSe_{(1-x)}S_x$ where x can be between 0 and 1, inclusively. The axis 601 represents the value of x, whereas the axis 602 represents the wavelength of the radiation emitted by the emitter 113. The line 603 shows the relationship between the wavelength and the value of x. When x=0, the wavelength is equal to about 690 nm. As the relative concentration of sulfur (as represented by the vaule of x) increases, the value of the wavelength decreases linearly until x=1, at which point the semiconductor crystal lattice formed is substantially CdS, as there is substantially no selenium is present in the compound semiconductor, and the wavelength is equal to about 487 nm.

It should be emphasized that the above-described embodiments are merely possible examples of implementations. Many variations and modifications may be made to the above-described embodiments. All such modifications and variations are intended to be included herein within the scope of the disclosure and protected by the following claims.

What is claimed is:

1. A method for emitting laser radiation, comprising:
emitting first laser radiation using a first laser, wherein said first laser is a laser diode;

receiving the first laser radiation by a second laser comprising $CdSe_{(1-x)}S_x$, wherein $0 \leq x \geq 1$, and responsive to receiving the first laser radiation by the second laser, emitting second laser radiation by the second laser via the $CdSe_{(1-x)}S_x$;

receiving third radiation from the first laser via a first photodiode, and receiving fourth radiation from the second laser via a second photodiode;

wherein the second laser radiation has a wavelength between 487 nm and 690 nm; and wherein the wavelength of the second laser radiation is determined at least in part by the relative concentrations of Selenium and Sulfur as represented by the value of x.

2. A method for emitting laser radiation, comprising:

emitting first laser radiation using a first laser, wherein said first laser is a laser diode;

receiving the first laser radiation by a second laser comprising $CdSe_{(1-x)}S_x$, wherein $0 \leq x \geq 1$, and responsive to receiving the first laser radiation by the second laser, emitting second laser radiation by the second laser via the $CdSe_{(1-x)}S_x$;

wherein the second laser radiation has a wavelength between 487 nm and 690 nm; and wherein the wavelength of the second laser radiation is determined at least in part by the relative concentrations of Selenium and Sulfur as represented by the value of x: and wherein the $CdSe_{(1-x)}S_x$ has a thickness between 2 μm and 5 μm, a width between 5 μm and 10 μm, and a length between 30 μm and 50 μm.

3. A system for emitting laser radiation, comprising:

a first laser configured to emit first laser radiation, wherein said first laser is a laser diode;

a second laser comprising $CdSe_{(1-x)}S_x$, wherein $0 \leq x \geq 1$, the second laser being configured to receive the first laser radiation and to emit second laser radiation responsive to receiving the first laser radiation;

a first photodiode that is configured to receive third radiation from the first laser, and a second photodiode that is configured to receive fourth radiation from the second laser;

wherein the second laser radiation has a wavelength between 487 nm and 690 nm; and wherein the wavelength of the second laser radiation is dependent upon the relative concentration of Selenium and/or Sulfur as represented by the value of X.

4. A system for emitting laser radiation, comprising:

a first laser configured to emit first laser radiation, wherein said first laser is a laser diode;

a second laser comprising $CdSe_{(1-x)}S_x$, wherein $0 \leq x \geq 1$, the second laser being configured to receive the first laser radiation and to emit second laser radiation responsive to receiving the first laser radiation;

wherein the second laser radiation has a wavelength between 487 nm and 690 nm; and wherein the wavelength of the second laser radiation is dependent upon the relative concentration of Selenium and/or Sulfur as represented by the value of X; and wherein the $CdSe_{(1-x)}S_x$ has a thickness between 2 μm and 5 μm, a width between 5 μm and 10 μm, and a length between 30 μm and 50 μm.

5. A semiconductor laser for emitting a light beam comprising:

a substrate;

a II-VI group semiconductor layer grown on the substrate having the formula $CdSe_{(1-x)}S_x$; wherein $0 \leq x \geq 1$;

a pair of reflective surfaces for forming an optical resonator, the layer of $CdSe_{(1-x)}S_x$ being positioned between the reflective surfaces, the semiconductor laser being adapted to be pumped by a pumping light source at a direction substantially perpendicular to the plane of the layer of the optical resonator; the pumping source being in excess of 50 mW; and wherein the top surface of the $CdSe_{(1-x)}S_x$ semiconductor layer has an antireflection coating through which the pumped light passes; and the longitudinal optical wave formed in the $CdSe_{(1-x)}S_x$ semiconductor layer as a result of the pumping light source has a longitudinal axis parallel to the longitudinal axis of the $CdSe_{(1-x)}S_x$ semiconductor layer, and the length of the active region of the $CdSe_{(1-x)}S_x$ semiconductor layer is a multiple of the wavelength of the longitudinal optical wave;

the semiconductor laser being operative to emit a light beam having a wavelength in the range of 487 nm and 690 nm, depending upon the relative concentration of selenium and/or sulfur in the $CdSe_{(1-x)}S_x$ layer.

6. The laser of claim 5 wherein the $CdSe_{(1-x)}S_x$ semiconductor layer has a width in the range of 5-10 μm, a depth of 2-5 μm and wherein the emitted light is emitted from the semiconductor laser in a direction parallel to the longitudinal axis of the semiconductor substrate.

7. The laser of claim 5 wherein the $CdSe_{(1-x)}S_x$ semiconductor layer has a crystal lattice structure which is formed on the crystal lattice structure of the substrate, and wherein the concentration of the Sulfur (S) in the crystal lattice structure is equal to X and the concentration of Selenium (Se) in the crystal lattice structure is equal to 1-X.

8. The laser of claim 7, wherein the $CdSe_{(1-x)}S_x$ semiconductor laser is pumped solely by a pumping laser and wherein the wavelength of the light which pumps the $CdSe_{(1-x)}S_x$ semiconductor laser is less than or substantially equal to that of the light beam emitted from the semiconductor laser.

* * * * *